(12) United States Patent
Lee et al.

(10) Patent No.: US 11,792,926 B2
(45) Date of Patent: Oct. 17, 2023

(54) DISPLAY APPARATUS

(71) Applicant: SAMSUNG DISPLAY CO., LTD., Yongin-si (KR)

(72) Inventors: Kyungmo Lee, Yongin-si (KR); Jongjin Lee, Yongin-si (KR); Minsu Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/818,555

(22) Filed: Aug. 9, 2022

(65) Prior Publication Data

US 2022/0382342 A1    Dec. 1, 2022

Related U.S. Application Data

(63) Continuation of application No. 17/171,335, filed on Feb. 9, 2021, now Pat. No. 11,412,611.

(30) Foreign Application Priority Data

Jul. 27, 2020 (KR) .......................... 10-2020-0093306

(51) Int. Cl.
*G06F 1/18* (2006.01)
*H05K 1/11* (2006.01)
*G09G 3/00* (2006.01)

(52) U.S. Cl.
CPC ............ *H05K 1/112* (2013.01); *G06F 1/183* (2013.01); *G09G 3/006* (2013.01); *G09G 2330/12* (2013.01); *H05K 2201/0338* (2013.01); *H05K 2201/10128* (2013.01); *H05K 2201/10189* (2013.01)

(58) Field of Classification Search
CPC ......... H05K 1/112; G06F 1/183; G09G 3/006
See application file for complete search history.

(56) References Cited

U.S. PATENT DOCUMENTS

| 7,184,117 | B2 | 2/2007 | Suzuki |
| 8,389,863 | B2 | 3/2013 | Kim et al. |
| 10,191,313 | B2 | 1/2019 | Qiu et al. |
| 2013/0004767 | A1 | 1/2013 | Daigaku et al. |
| 2021/0325714 | A1 | 10/2021 | Shin et al. |

FOREIGN PATENT DOCUMENTS

| KR | 10-0621167 B1 | 9/2006 |
| KR | 10-2013-0027481 A | 3/2013 |
| KR | 10-2019-0008956 A | 1/2019 |
| KR | 10-1944915 B1 | 2/2019 |
| KR | 10-2019-0121469 A | 10/2019 |

*Primary Examiner* — Jeremy C Norris
(74) *Attorney, Agent, or Firm* — Lewis Roca Rothgerber Christie LLP

(57) ABSTRACT

Provided is a display apparatus including: a display panel including a display area and a peripheral area; a printed circuit board attached to the peripheral area and including a ground portion and a test electrode spaced apart from the ground portion; a connector including a plurality of connector terminals connected to an external control apparatus and electrically connecting the printed circuit board and the external control apparatus to each other; and a cover layer arranged on the printed circuit board and covering at least a part of the printed circuit board. Accordingly, not only the display quality and reliability of the electric characteristics of the display apparatus are improved, but also a loss is reduced and a yield is improved during manufacturing processes.

20 Claims, 7 Drawing Sheets

DISPLAY APPARATUS

CROSS-REFERENCE TO RELATED APPLICATIONS

This application is a continuation of U.S. patent application Ser. No. 17/171,335, filed Feb. 9, 2021, which claims priority to and the benefit of Korean Patent Application No. 10-2020-0093306, filed Jul. 27, 2020, the entire content of both of which is incorporated herein by reference.

BACKGROUND

1. Field

The present disclosure relates to a display apparatus including a printed circuit board.

2. Description of Related Art

Mobility-based electronic devices have been widely used. Recently, tablet personal computers (PCs), in addition to small-sized electronic devices, such as mobile phones, have been widely used as mobile electronic devices.

Such mobile electronic devices include display apparatuses to provide various functions, for example, visual information such as an image or a video, to a user. Recently, with the miniaturization of components for driving the display apparatuses, the area occupied by display apparatuses in electronic devices has been gradually increasing, and thus, display apparatuses having various characteristics and functions have been developed.

The display apparatuses may include display panels including display areas and peripheral areas. Driving units, printed circuit boards, and the like for driving the display panels may be arranged in the peripheral areas of the display panels. Because the printed circuit boards are configured to transmit, to the driving units, electric signals applied from external control apparatuses, the printed circuit boards may be suitably protected from electro-magnetic interference (EMI) and electro-static discharge (ESD) for quality and reliability of the display apparatuses.

SUMMARY

Provided are display apparatuses in which not only display quality and reliability of electric characteristics are improved by reducing effects of electro-magnetic interference (EMI) and electro-static discharge (ESD), but also in which a loss is reduced and a production yield is improved during manufacturing processes. However, the scope of the present disclosure is not limited thereby.

Additional aspects will be set forth in part in the description which follows and, in part, will be apparent from the description, or may be learned by practice of the presented embodiments of the present disclosure.

According to one or more embodiments, a display apparatus includes a display panel including a display area and a peripheral area, a printed circuit board attached to the peripheral area, and including a ground portion, and a test electrode spaced from the ground portion, a connector including connector terminals for electrically connecting the printed circuit board and an external control apparatus to each other, and a cover layer on and covering at least a part of the printed circuit board.

The cover layer may overlap the ground portion and the test electrode.

The cover layer may be connected to the ground portion and the test electrode.

The cover layer may include a conductive material.

The cover layer may include copper (Cu).

The cover layer may include conductive fabric.

One connector terminal from among the connector terminals may be electrically connected to the test electrode.

Another connector terminal from among the connector terminals may be electrically connected to the ground portion.

The test electrode, the cover layer, and the ground portion may form a current path for a current applied to the one connector terminal.

The printed circuit board may further include a first terminal and a second terminal, which are respectively electrically connected to the test electrode and the ground portion.

The first terminal and the second terminal might not overlap the cover layer.

The test electrode, the cover layer, and the ground portion may form a current path through which a current applied to the first terminal flows.

According to one or more embodiments, a display apparatus includes a display panel including a pixel circuit, a driver integrated circuit configured to apply an electric signal to the pixel circuit, a printed circuit board electrically connected to the driver integrated circuit, and including a ground portion, and a test electrode spaced apart from the ground portion, a connector connected to one side of the printed circuit board, and including connector terminals for connection to an external control apparatus, and a conductive layer on and covering at least a part of the printed circuit board, wherein, the ground portion is configured to receive a current applied to the test electrode via the conductive layer.

The conductive layer may overlap the ground portion and the test electrode.

The conductive layer may be connected to the ground portion and the test electrode.

One connector terminal from among the connector terminals may be electrically connected to the test electrode.

Another connector terminal from among the connector terminals may be electrically connected to the ground portion.

The conductive layer may include a metal layer or conductive fabric including copper (Cu).

The printed circuit board may further include a first terminal and a second terminal, which are respectively electrically connected to the test electrode and the ground portion.

The test electrode, the conductive layer, and the ground portion may form a current path through which a current applied to the first terminal flows.

Other aspects, features, and advantages other than those described above will become apparent from the detailed descriptions, claims and drawings for carrying out the following disclosure.

These general and specific aspects may be practiced using a system, method, computer program, or any combination of systems, methods, and computer programs.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
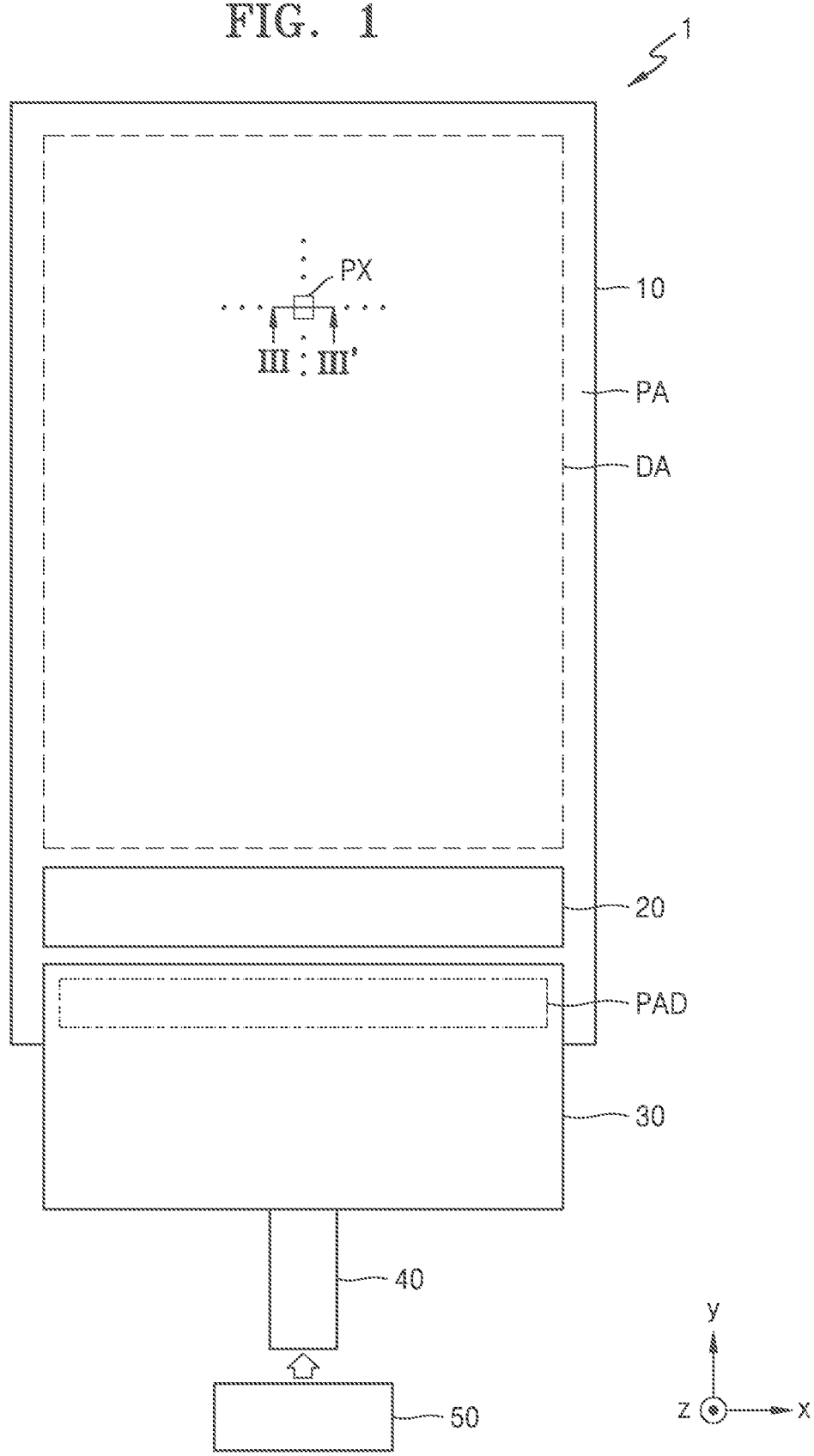
FIG. 1 is a plan view of a display apparatus, according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display apparatus 1, according to some embodiments.

Referring to FIG. 1, the display apparatus 1 may include a display panel 10, a driver integrated circuit 20, a printed circuit board (PCB) 30, a connector 40, and an external control apparatus 50.

The display panel 10 may include a display area DA and a peripheral area PA located outside the display area DA. The display panel 10 may provide an image via an array of pixels PX arranged in the display area DA. Each of the pixels PX may include an emission element for emitting a certain light (for example, a red, green, or blue light), and the display panel 10 may provide an image by using the lights emitted through the emission elements.

According to some embodiments, the display area DA may be rectangular with a longer length in a ±y direction. Alternatively, the display area DA may be polygonal, such as rectangular with a longer length in a ±x direction, or square, or may be oval or circular.

The peripheral area PA may be an area that does not provide an image, and may be a non-display area. The peripheral area PA may entirely or partially surround the display area DA. The driver integrated circuit 20 may be provided in the peripheral area PA. The driver integrated circuit 20 may be mounted on the display panel 10 in a chip-on-class (CoG) manner, chip-on-film (CoF) manner, or a chip-on-plastic (CoP) manner. The driver integrated circuit 20 generates an electric signal in response to power and signals received from an external source, and provides the electric signal to each of pixel circuits PC of FIG. 2 arranged in the display area DA.

Also, a pad portion PAD electrically connected to the driver integrated circuit 20 via wiring or via a conductive layer may be arranged in the peripheral area PA. The PCB 30 may be attached on the pad portion PAD of the peripheral area PA. In other words, the PCB 30 may be electrically connected to the driver integrated circuit 20 via the pad portion PAD. The PCB 30 may be attached to the pad portion PAD by an adhesive member, such as an anisotropic conductive film (ACF).

The connector 40 may be connected to, or mounted on, one side of the PCB 30. The PCB 30 may be electrically connected to the external control apparatus 50 via the connector 40. The external control apparatus 50 may be, for example, an application processor (AP), and may include an external power supply unit for supplying power. The PCB 30 may access the external control apparatus 50 to transmit, to the driver integrated circuit 20 and the display panel 10, a control signal and/or power received from the external control apparatus 50. According to some embodiments, the PCB 30 may be a flexible PCB (FPCB) with flexible characteristics. The FPCB may be bent or curved, and may overlap at least a partial region of the display panel 10 by being bent below a rear surface of the display panel 10.

Although the lengths of the driver integrated circuit 20 and the PCB 30 in the ±x direction are each illustrated to be the same as the length of the display area DA in the ±x direction in FIG. 1, the lengths thereof are not limited thereto, and the lengths may be different from each other. For example, the lengths of the driver integrated circuit 20 and the PCB 30 in the ±x direction may each be smaller than the length of display area DA in the ±x direction.

Figure 2:
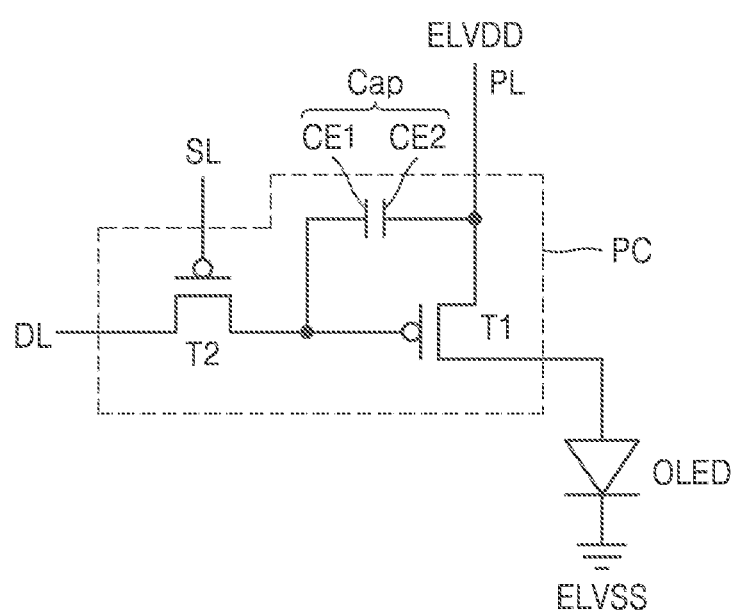
FIG. 2 is an equivalent circuit diagram of one pixel circuit of a display apparatus, according to some embodiments.

FIG. 2 is an equivalent circuit diagram of one pixel circuit PC included in a display apparatus, according to some embodiments.

Referring to FIG. 2, the display apparatus 1 of FIG. 1 may include an emission element and the pixel circuit PC. The emission element may include a light-emitting diode, for example, an organic light-emitting diode OLED. The organic light-emitting diode OLED may be electrically connected to the pixel circuit PC, and may emit light by receiving a driving voltage via the pixel circuit PC. The emission element emits a light through an emission area, and the emission area may be defined as the pixel PX of FIG. 1.

The pixel circuit PC may include a plurality of thin-film transistors and a storage capacitor. According to some embodiments, the pixel circuit PC may include a first thin-film transistor T1, a second thin-film transistor T2, and a storage capacitor Cap.

The second thin-film transistor T2 is a switching thin-film transistor, is connected to a scan line SL and to a data line DL, and may be configured to transmit a data voltage (or a data signal) input from the data line DL to the first thin-film transistor T1 based on a switching voltage (or a switching signal) input from the scan line SL.

The storage capacitor Cap is connected to the second thin-film transistor T2 and to a driving voltage line PL, and may store a voltage corresponding to a difference between a voltage received from the second thin-film transistor T2 and a first power voltage ELVDD supplied to the driving voltage line PL. The storage capacitor Cap may include at least a first capacitor plate CE1 and a second capacitor plate CE2.

The first thin-film transistor T1 is a driving thin-film transistor, is connected to the driving voltage line PL and to the storage capacitor Cap, and may control a driving current flowing through the organic light-emitting diode OLED from the driving voltage line PL in response to a voltage value stored in the storage capacitor Cap. The organic light-emitting diode OLED may emit a light of a certain luminance according to the driving current. An opposing electrode (for example, a cathode) of the organic light-emitting diode OLED may receive a second power voltage ELVSS.

In FIG. 2, the pixel circuit PC includes two thin-film transistors and one storage capacitor, but the present disclosure is not limited thereto. For example, the pixel circuit PC may include three or more thin-film transistors and/or two or more storage capacitors. According to some embodiments, the pixel circuit PC may include seven thin-film transistors and one storage capacitor. The numbers of thin-film transistors and storage capacitors may vary depending on a design of the pixel circuit PC. However, for convenience of description, a case in which the pixel circuit PC includes two thin-film transistors and one storage capacitor will be described hereinbelow.

Figure 3:
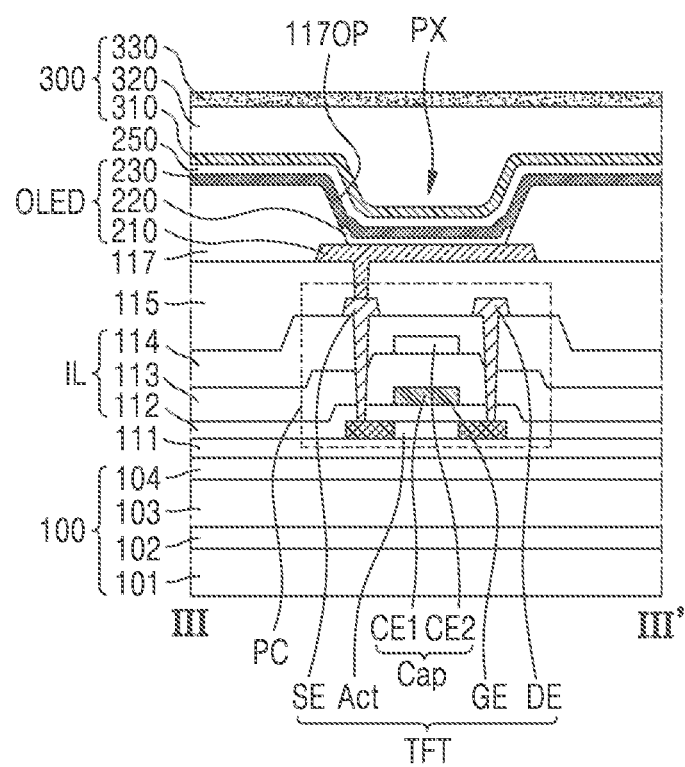
FIG. 3 is a cross-sectional view of a part of the display apparatus of FIG. 1, according to some embodiments.

FIG. 3 is a cross-sectional view of a part of the display apparatus 1 of FIG. 1, and may correspond to a cross section taken along the line III-Ill' of FIG. 1.

Referring to FIG. 3, a substrate 100 may have a multi-layer structure including an inorganic layer and a base layer including polymer resin. For example, the substrate 100 may include a barrier layer of an inorganic insulating layer, and the base layer including the polymer resin. For example, the substrate 100 may include a first base layer 101, a first barrier layer 102, a second base layer 103, and a second barrier layer 104, which are sequentially stacked. The first base layer 101 and the second base layer 103 may include polyether sulfone, polyacrylate, polyether imide, polyethylene naphthalate, polyethylene terephthalate, polyphenylene sulfide, polyacrylate, polyimide, polycarbonate or cellulose acetate propionate. The first barrier layer 102 and the second barrier layer 104 may include an inorganic insulating material such as silicon oxide, silicon oxynitride, and/or silicon nitride.

A buffer layer 111 may be arranged on the substrate 100. The buffer layer 111 may reduce or block the penetration of foreign materials, moisture, or ambient air from the bottom portion of the substrate 100, and may provide a flat surface on the substrate 100. The buffer layer 111 may include an inorganic insulating material, such as silicon oxide, silicon oxynitride, or silicon nitride, and may have a single-layer or multi-layer structure including such a material.

The pixel circuit PC may be provided on the buffer layer 111. The pixel circuit PC may include a thin-film transistor TFT and the storage capacitor Cap.

The thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act. A first gate insulating layer 112 may be between the semiconductor layer Act and the gate electrode GE, and a second gate insulating layer 113 and an interlayer insulating layer 114 may be between the gate electrode GE and the source electrode SE and/or between the gate electrode GE and the drain electrode DE.

The storage capacitor Cap may overlap the thin-film transistor TFT. The storage capacitor Cap may include the first capacitor plate CE1 and the second capacitor plate CE2 that overlap each other. According to some embodiments, the gate electrode GE of the thin-film transistor TFT may include the first capacitor plate CE1 of the storage capacitor Cap. The second gate insulating layer 113 may be between the first capacitor plate CE1 and the second capacitor plate CE2.

The semiconductor layer Act may include polysilicon. According to some embodiments, the semiconductor layer Act may include amorphous silicon. According to some embodiments, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer Act may include the channel region, and the source region and the drain region where impurities are doped.

The first gate insulating layer 112 may include an inorganic insulating material, such as silicon oxide, silicon oxynitride, or silicon nitride, and may have a single-layer or multi-layer structure including such a material.

The gate electrode GE or first capacitor plate CE1 may include a low-resistance conductive material such as molybdenum (Mo), aluminum (Al), copper (Cu), and/or titanium (Ti), and may have a single-layer or multi-layer structure including such a material.

The second gate insulating layer 113 may include an inorganic insulating material, such as silicon oxide, silicon oxynitride, or silicon nitride, and may have a single-layer or multi-layer structure including such a material.

The second capacitor plate CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single-layer or multi-layer structure including such a material.

The interlayer insulating layer 114 may include an inorganic insulating material, such as silicon oxide, silicon oxynitride, or silicon nitride, and may have a single-layer or multi-layer structure including such a material.

The source electrode SE or drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single-layer or multi-layer structure including such a material. For example, the source electrode SE or drain electrode DE may have a three-layer structure of titanium layer/aluminum layer/titanium layer.

A planarization layer 115 may be provided on the first gate insulating layer 112, the second gate insulating layer 113, and the interlayer insulating layer 114. The planarization layer 115 may be arranged on the thin-film transistor TFT of the pixel circuit PC. For example, the planarization layer 115 may be between the thin-film transistor TFT of the pixel circuit PC and a pixel electrode 210. The planarization layer 115 may include an organic insulating material. The planarization layer 115 may include an organic insulating material such as acryl, benzo cyclobutene (BCB), polyimide, or hexamethyldisiloxane (HMDSO). The organic insulating material of the planarization layer 115 may be a photosensitive organic insulating material.

The pixel electrode 210 may be arranged on the planarization layer 115. The pixel electrode 210 may be electrically connected to the pixel circuit PC via a contact hole on the planarization layer 115.

The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 210 may include the reflective layer including such a material, and a transparent conductive layer on and/or below the reflective layer. The transparent conductive layer may include indium tin oxide (ITO), indium zinc oxide (IZO), zinc oxide (ZnO), indium oxide (In2O3), indium gallium oxide (IGO), or aluminum zinc oxide (AZO). According to some embodiments, the pixel electrode 210 may have a three-layer structure of ITO layer/Ag layer/ITO layer that are sequentially stacked.

A pixel-defining layer 117 may be arranged on the pixel electrode 210. The pixel-defining layer 117 may include an opening 1170P covering an edge of the pixel electrode 210 and overlapping a center portion of the pixel electrode 210.

The pixel-defining layer 117 may increase a distance between the edge of the pixel electrode 210 and an opposing electrode 230 on the pixel electrode 210, thereby reducing or preventing the likelihood of an occurrence of an arc at the edge of the pixel electrode 210. The pixel-defining layer 117 may be formed via a method, such as spin coating, using an organic insulating material, such as polyimide, polyamide, acryl resin, benzo cyclobutene, HMDSO, or phenol resin.

An intermediate layer 220 is provided on the pixel-defining layer 117 to correspond to the pixel electrode 210. The intermediate layer 220 may include a high-molecular weight organic material or low-molecular weight organic material, which emit a light of certain color.

The opposing electrode 230 is provided on the intermediate layer 220. The opposing electrode 230 may include a conductive material with a relatively low work function. For example, the opposing electrode 230 may include a (semi-) transparent layer including Ag, Mg, Al, Ni, Cr, Li, Ca, or an alloy thereof. The opposing electrode 230 may further include a layer including ITO, IZO, ZnO, or In2O3, on the (semi-) transparent layer including such a material. According to some embodiments, the opposing electrode 230 may include Ag and Mg.

A stacked structure of the pixel electrode 210, the intermediate layer 220, and the opposing electrode 230 may form a light-emitting diode, for example, the organic light-emitting diode OLED. The organic light-emitting diode OLED may emit a red, green, or blue light, and an emission region of each organic light-emitting diode OLED may correspond to the pixels PX. Because the opening 1170P of the pixel-defining layer 117 defines the size and/or width of the emission region, the size and/or width of pixels PX are dependent on the size and/or width of the corresponding opening 1170P of the pixel-defining layer 117.

A capping layer 250 may be provided on the opposing electrode 230. The capping layer 250 may include lithium fluoride (LiF). Alternatively, the capping layer 250 may include an inorganic insulating material, such as silicon nitride, and/or may include an organic insulating material. According to some embodiments, the capping layer 250 may be omitted.

A thin-film encapsulation layer 300 may be arranged on the capping layer 250. The organic light-emitting diode OLED may be covered by the thin-film encapsulation layer 300. The thin-film encapsulation layer 300 may include first and second inorganic encapsulation layers 310 and 330, and an organic encapsulation layer 320 therebetween.

The first and second inorganic encapsulation layers 310 and 330 may each include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed via a chemical vapor deposition method.

The organic encapsulation layer 320 may include a polymer-based material. Examples of the polymer-based material may include an acrylic resin, an epoxy resin, polyimide, and/or polyethylene. For example, the organic encapsulation layer 320 may include acrylic resin, such as polymethyl methacrylate, polyacrylic acid, or the like. The organic encapsulation layer 320 may be formed by curing monitor or applying polymer.

In other embodiments, an overcoating layer and an optical function layer, such as a touch input layer, a reflection prevention layer, and/or a color filter layer, may be arranged on the thin-film encapsulation layer 300.

Figure 4:
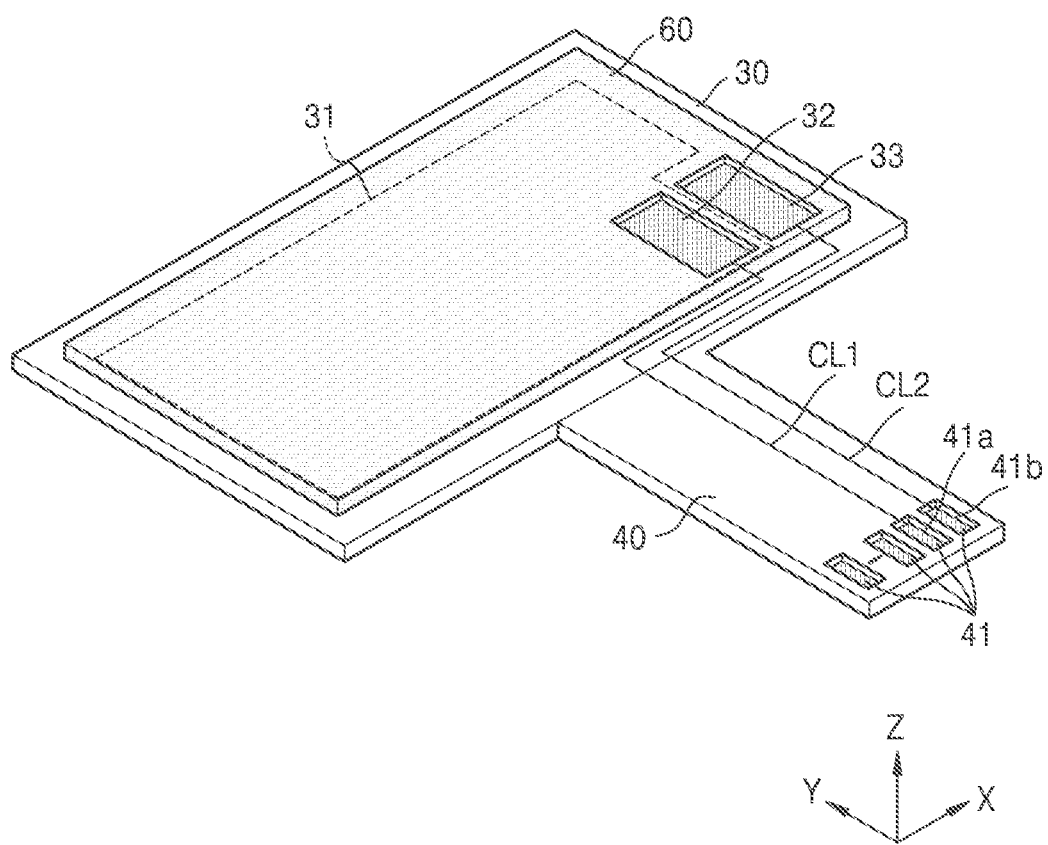
FIG. 4 is a perspective view of a part of a display apparatus, according to some embodiments.

FIG. 4 is a perspective view of a part of the display apparatus, according to some embodiments, wherein the PCB 30 and peripheral components thereof are mainly excerpted from among the display apparatus.

Referring to FIG. 4, the PCB 30 may include a circuit pattern portion 31. The circuit pattern portion 31 may include a circuit pattern configured to transmit a signal and/or power from an external control apparatus to the driver integrated circuit 20 of FIG. 1. Also, an electronic device including a transistor, a semiconductor chip, a resistor, a capacitor, a condenser, an inductor, or the like may be mounted on the circuit pattern portion 31.

The PCB 30 may include a ground portion 32. For example, the ground portion 32 may be a portion of the circuit pattern portion 31. The ground portion 32 may be connected to a ground of the display apparatus 1 (see FIG. 1), and configured to provide a reference potential for determining whether the PCB 30, along with devices mounted on the PCB 30, operate.

The PCB 30 may include a test electrode 33. The test electrode 33 may be spaced apart from the ground portion 32. Accordingly, the test electrode 33 may not be directly electrically connected to the circuit pattern portion 31 and to the ground portion 32. However, as will be described below, the test electrode 33 may be indirectly electrically connected to the circuit pattern portion 31 and the ground portion 32 through a cover layer 60.

For example, the circuit pattern portion 31, the ground portion 32, and the test electrode 33 may be provided at a same layer, or may be provided at different layers. Hereinafter, for convenience of description, a case where the circuit pattern portion 31, the ground portion 32, and the test electrode 33 are provided at the same layer will be mainly described.

The circuit pattern portion 31, the ground portion 32, and the test electrode 33 may be formed by patterning a metal layer. For example, the metal layer may be first formed on a base of the PCB 30, and the metal layer may be patterned via exposure, development, and detachment processes to form the circuit pattern portion 31, the ground portion 32, and the test electrode 33. The metal layer may include a metal material having high conductivity, such as Cu. Various circuit formation methods, such as a subtractive method using a dry film, a semi-additive process (SAP) method, and a plasma semi-additive process (PSAP) method, may be applied to the exposure, development, and detachment processes.

Next, a protective layer may be formed on the metal layer, and the protective layer may include an insulating material. The protective layer may include an opening such that one surface of the ground portion 32 and one surface of the test electrode 33 are exposed. Accordingly, respective surfaces of the ground portion 32 and test electrode 33, and one surface of the protective layer, may form a stepped portion. The opening may be formed via, for example, laser drilling or computer numerical control (CNC) drilling.

The circuit pattern portion 31 among the patterned metal layer on the base of the PCB 30 is covered by the protective layer of the PCB 30, and in FIG. 4, an area of the PCB 30 is shown in a broken line. However, because the ground portion 32 and test electrode 33 are exposed by the opening of the protective layer, the ground portion 32 and the test electrode 33 are shown in FIG. 4.

Meanwhile, for convenience of illustration, the base, the metal layer, and the protective layer of the PCB 30 are shown as one component as a whole.

The connector 40 may be connected to one side of the PCB 30. For example, the connector 40 and the PCB 30 may be integrally formed. As another example, the connector 40 and the PCB 30 may be independently formed, and the connector 40 may be mounted on one side of the PCB 30. One end of the connector 40 may be electrically connected to the PCB 30, and the other end thereof may be electrically connected to an external control apparatus. In other words, the connector 40 may electrically connect the PCB 30 and the external control apparatus.

A plurality of connector terminals 41 may be provided on the other end of the connector 40. The plurality of connector terminals 41 may enable access of the external control apparatus. Different electric signals may be transmitted respectively via the plurality of connector terminals 41, or a same electric signal may be transmitted via the plurality of connector terminals 41.

Each of the plurality of connector terminals 41 may be electrically connected to the circuit pattern portion 31 of the PCB 30 via conductive lines. According to some embodiments, among the plurality of connector terminals 41, a first connector terminal 41a may be electrically connected to the ground portion 32 of the PCB 30 via a first conductive line CL1, and a second connector terminal 41b may be electrically connected to the test electrode 33 of the PCB 30 via a second conductive line CL2. The plurality of connector terminals 41 and conductive lines may include a metal material having high conductivity, such as Cu, in a manner similar to the circuit pattern portion 31, ground portion 32, and test electrode 33.

The display apparatus 1 of FIG. 1 according to some embodiments may include the cover layer 60 on the PCB 30. The cover layer 60 may be adhered to one surface of the PCB 30 via an adhesive member coated on one surface thereof. The cover layer 60 may cover at least a part of the PCB 30. The cover layer 60 may overlap the test electrode 33 and the ground portion 32 of the PCB 30. As described above, because respective surfaces of the ground portion 32 and test electrode 33 are exposed by the opening of the protective layer of the PCB 30, the cover layer 60 may be directly adhered to the ground portion 32 and test electrode 33 via the adhesive member, and accordingly, the cover layer 60 may be connected to the ground portion 32 and test electrode 33.

The cover layer 60 is a conductive layer and may include a conductive material. According to some embodiments, the cover layer 60 may be a metal layer including a metal material having high conductivity, such as Cu. According to other embodiments, the cover layer 60 may include conductive fabric that may be, for example, Ni- and/or Cu-coated fiber.

Electronic devices mounted on the PCB 30 may operate according to a high-frequency signal, and electromagnetic waves or static electricity may be generated by the high-frequency signal. Such electromagnetic waves or static electricity may cause interference with an electric signal transmitted to the display panel 10, and may be emitted to the outside of, or beyond, the display apparatus 1 to cause malfunction of peripheral devices. According to some embodiments, the cover layer 60 connected to the ground portion 32 shields the PCB 30 to reduce an adverse effect caused by electromagnetic interference (EMI) and electrostatic discharge (ESD), thereby improving display quality and reliability on electric characteristics of the display apparatus 1.

When the adhesion between the cover layer 60 and ground portion 32 is poor, the electromagnetic-waves-and-static-electricity-shielding performance of the cover layer 60 may decrease, leading to a defect in the display apparatus 1. Accordingly, an inspection process for an adhesive defect between the cover layer 60 and the ground portion 32 (hereinafter, referred to as an adhesion defect inspection or adhesion defect inspection process) may be suitably used during manufacturing processes of the display apparatus 1. According to some embodiments, to determine the adhesion defect between the cover layer 60 and the ground portion 32, bonding resistance between the cover layer 60 and the ground portion 32 may be used. For example, the bonding resistance between the cover layer 60 and the ground portion 32 may increase when the adhesion between the cover layer 60 and the ground portion 32 is poorer. Accordingly, the adhesion defect may be determined via the bonding resistance and an inspection method related to the bonding resistance will be described below with reference to FIG. 5.

Figure 5:
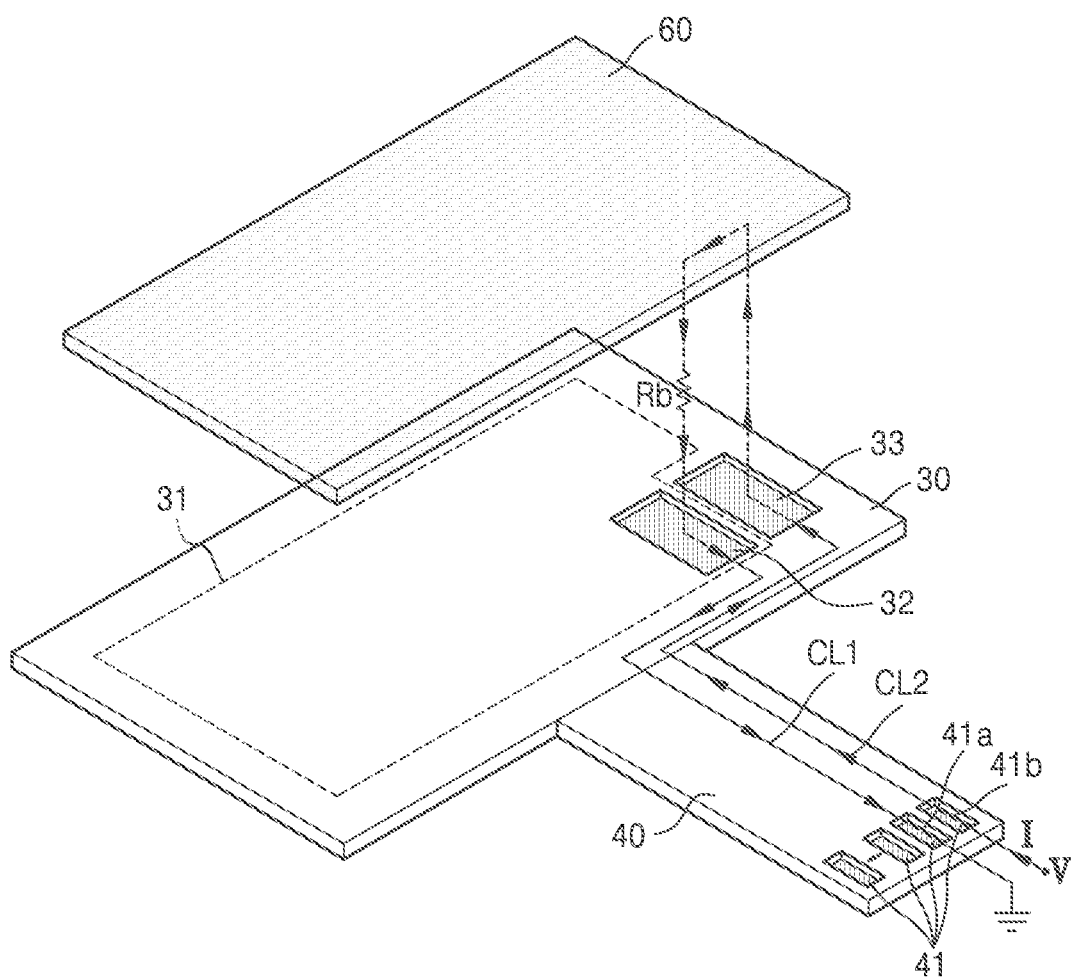
FIG. 5 is an exploded perspective view of the part of the display apparatus of FIG. 4, according to some embodiments.

FIG. 5 is an exploded perspective view of the part of the display apparatus of FIG. 4. Descriptions about components that are same as, or that correspond to, those described with reference to FIG. 4 will be omitted for brevity of the description.

Referring to FIG. 5, to inspect the adhesion defect between the cover layer 60 and ground portion 32, the first connector terminal 41a and the second connector terminal 41b may be connected to an inspection device. The inspection device may apply a test current I to the second connector terminal 41b. When the test current I is applied to the second connector terminal 41b, the test electrode 33, the cover layer 60, and the ground portion 32 may form a current path where the test current I flows. In particular, because the second connector terminal 41b is electrically connected to the test electrode 33 via the second conductive line CL2, because the test electrode 33 is connected to the cover layer 60, and because the cover layer 60 is connected to the ground portion 32, the test current I applied to the second connector terminal 41b may sequentially flow along the test electrode 33, the cover layer 60, and the ground portion 32.

At this time, the inspection device may measure a voltage V at the second connector terminal 41b. Because the first connector terminal 41a is electrically connected to the ground portion 32 via the first conductive line CL1, the potential at the first connector terminal 41a may be a reference potential. Accordingly, the voltage V at the second connector terminal 41b may denote a potential difference between the first connector terminal 41a and the second connector terminal 41b.

Consequently, because the value of the test current I and the value of voltage V at the second connector terminal 41b are known, total resistance Rt on the current path of the test current I may be calculated by using Equation 1 below.

$$Rt = \frac{V}{I} \qquad \text{Equation 1}$$

Here, the total resistance Rt may include a bonding resistance Rb. The bonding resistance Rb among the total resistance Rt varies depending on the adhesion defect between the cover layer 60 and ground portion 32, but other resistances corresponding to the total resistance Rt excluding the bonding resistance Rb may have fixed values. Accordingly, the adhesion defect may be determined when the total resistance Rt including the bonding resistance Rb is higher than an expected value (e.g., a pre-determined normal value), and satisfactory adhesion may be determined when the total resistance Rt is equal to or lower than the normal value.

As a comparison example, to measure bonding resistance between a cover layer and a ground portion, a portion of the ground portion may be exposed by removing a portion of the cover layer, which overlaps the ground portion. In the comparison example, an inspection device may be connected to the cover layer, and the exposed portion of the ground portion to measure the bonding resistance. In such a destructive adhesion defect inspection, inspection is performed by sampling some of manufactured display apparatuses, and accordingly, separate processes of sampling and removing the cover layer may be necessary.

However, according to some embodiments described above, because the first connector terminal 41a that is electrically connected to the ground portion 32, the test electrode 33, and the second connector terminal 41b that is electrically connected to the test electrode 33 are provided, the adhesion defect inspection may be performed by using the first connector terminal 41a and the second connector terminal 41b without having to remove the cover layer 60. In such a non-destructive adhesion defect inspection, some manufactured display apparatuses need not be sampled, and quality control is enabled for all manufactured display apparatuses.

Further, in such a non-destructive adhesion defect inspection, because a normal product may be manufactured by performing a recompression process on a product that is determined to have an adhesion defect according to an inspection result, a loss caused by disposal of defective products may be reduced.

Furthermore, an adhesion defect inspection process may be performed concurrently or substantially simultaneously with an existing inspection process (for example, an inspection process for normal operation of a display panel) or may be performed immediately after a process of adhering the cover layer 60, and separate processes of sampling or removing a cover layer may be omitted. Accordingly, a loss may be reduced, and a yield may be increased during manufacturing processes of the display apparatus.

Figure 6:
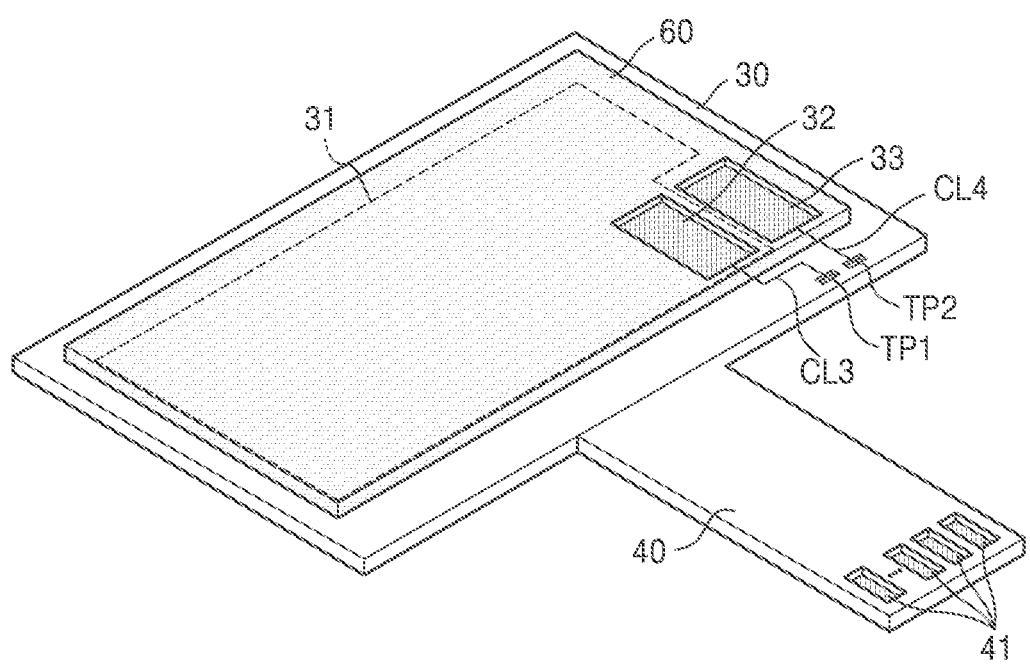
FIG. 6 is a perspective view of a part of a display apparatus, according to another embodiment.

FIG. 6 is a perspective view of a part of a display apparatus, according to other embodiments. Descriptions about components that are same as, or that correspond to, those described with reference to FIG. 4 will be omitted, and differences will be mainly described.

Referring to FIG. 6, the PCB 30 may include a first terminal TP1 and a second terminal TP2 respectively electrically connected to the ground portion 32 and the test electrode 33. For example, the ground portion 32 and the first terminal TP1 may be connected via a third conductive line CL3, and the test electrode 33 and the second terminal TP2 may be connected via a fourth conductive line CL4. The first terminal TP1 and second terminal TP2 may be formed at the same layer(s) as the ground portion 32 and test electrode 33, and may include the same materials as the ground portion 32 and test electrode 33. The protective layer of the PCB 30 may include an opening such that respective surfaces of the first terminal TP1 and second terminal TP2 are exposed. The first terminal TP1 and second terminal TP2 may not overlap the cover layer 60.

Figure 7:
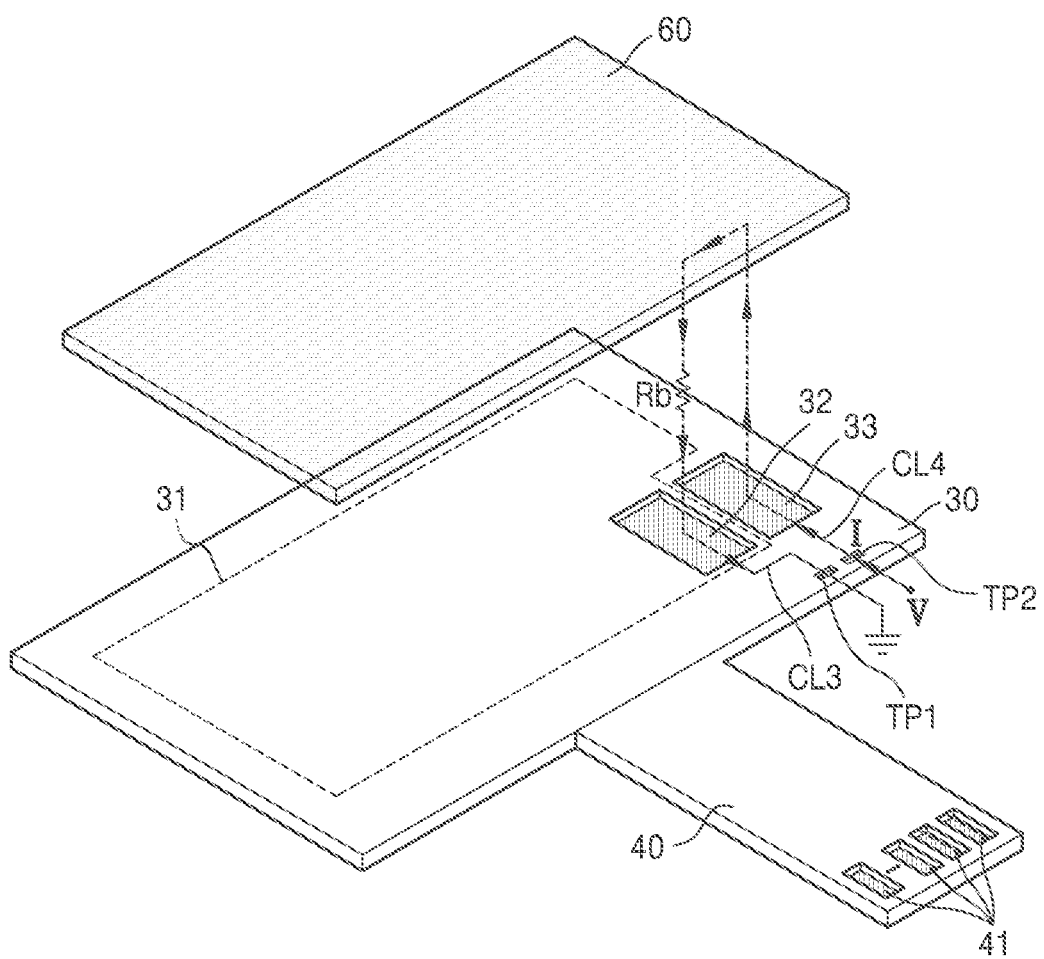
FIG. 7 is an exploded perspective view of the part of the display apparatus of FIG. 6, according to some embodiments.

FIG. 7 is an exploded perspective view of the part of the display apparatus of FIG. 6. Descriptions about components that are same as, or that correspond to, those described with reference to FIGS. 4 and 6 will be omitted for brevity of the description.

According to other embodiments, the first terminal TP1 and the second terminal TP2 may be used to inspect the adhesion defect between the cover layer 60 and ground portion 32. An inspection device, for example, an auto-resistance tester, may be connected to the first terminal TP1 and second terminal TP2.

The inspection device may apply the test current I to the second terminal TP2. When the test current I is applied to the second terminal TP2, the test electrode 33, the cover layer 60, and the ground portion 32 may form a current path where the test current I flows.

At this time, the inspection device may measure a voltage V at the second terminal TP2. Because the first terminal TP1 is electrically connected to the ground portion 32, a potential at the first terminal TP1 may be a reference potential. Accordingly, the voltage V at the second terminal TP2 may denote a potential difference between the first terminal TP1 and the second terminal TP2.

Consequently, because the value of the test current I and the value of voltage V at the second terminal TP2 are known, the total resistance Rt on the current path of the test current I may be calculated by using Equation 1 above. Here, the total resistance Rt may include the bonding resistance Rb. As described above, the bonding resistance Rb among the total resistance Rt varies depending on the adhesion defect between the cover layer 60 and ground portion 32, but other resistances corresponding to the total resistance Rt, and excluding the bonding resistance Rb, may have fixed values. Accordingly, the adhesion defect may be determined when a resistance value of the total resistance Rt including the bonding resistance Rb is higher than an expected value (e.g., a pre-determined normal value), and satisfactory adhesion may be determined when the resistance value of the total resistance Rt is equal to or lower than the expected/normal value.

Because the first terminal TP1 and the second terminal TP2 are located on the PCB 30, the third conductive line CL3 and fourth conductive line CL4 may be relatively short, and resistances by the third conductive line CL3 and fourth conductive line CL4 may be reduced. Accordingly, the ratio of the bonding resistance Rb among the total resistance Rt becomes relatively high, and thus a more accurate result of adhesion defect inspection may be obtained.

Hereinabove, a display apparatus has been mainly described but the present disclosure is not limited thereto. For example, a method of manufacturing such a display apparatus will also be within the scope of the present disclosure.

According to embodiments described above, display quality and reliability on electric characteristics of a display apparatus may be improved by reducing EMI and ESD on PCB by using a cover layer. Also, because an inspection for an adhesion defect of the cover layer is performed non-destructively, a loss may be reduced, and a yield may be improved during manufacturing processes of the display apparatus. However, the scope of the present disclosure is not limited by such aspects.

It should be understood that embodiments described herein should be considered in a descriptive sense only and not for purposes of limitation. Descriptions of features or aspects within the described embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
a display panel comprising a display area and a peripheral area;
a printed circuit board attached to the peripheral area, and comprising a ground portion, and a test electrode spaced from the ground portion;
a connector comprising connector terminals for electrically connecting the printed circuit board and an external control apparatus to each other;
a cover layer on and covering at least a part of the printed circuit board; and
an adhesive disposed between the printed circuit board and the cover layer.

2. The display apparatus of claim 1, wherein the cover layer overlaps the ground portion and the test electrode.

3. The display apparatus of claim 2, wherein the cover layer is connected to the ground portion and the test electrode.

4. The display apparatus of claim 1, wherein the cover layer comprises a conductive material.

5. The display apparatus of claim 4, wherein the cover layer comprises metal layer or conductive layer.

6. The display apparatus of claim 4, wherein the cover layer comprises conductive fabric.

7. The display apparatus of claim 1, wherein one connector terminal from among the connector terminals is electrically connected to the test electrode.

8. The display apparatus of claim 7, wherein another connector terminal from among the connector terminals is electrically connected to the ground portion.

9. The display apparatus of claim 7, wherein, the test electrode, the cover layer, and the ground portion form a current path for a current applied to the one connector terminal.

10. The display apparatus of claim 1, wherein the printed circuit board further comprises a first terminal and a second terminal, which are respectively electrically connected to the test electrode and the ground portion.

11. The display apparatus of claim 10, wherein the first terminal and the second terminal do not overlap the cover layer.

12. The display apparatus of claim 10, wherein the test electrode, the cover layer, and the ground portion form a current path through which a current applied to the first terminal flows.

13. A display apparatus comprising:
- a display panel comprising a pixel circuit;
- a driver integrated circuit configured to apply an electric signal to the pixel circuit;
- a printed circuit board electrically connected to the driver integrated circuit, and comprising a ground portion, and a test electrode spaced apart from the ground portion;
- a protective layer comprising an opening exposing one surface of the ground portion and one surface of the test electrode;
- a connector connected to one side of the printed circuit board, and comprising connector terminals for connection to an external control apparatus; and
- a conductive layer on the protective layer and overlapping the ground portion and the test electrode exposed by the opening.

14. The display apparatus of claim 13, further comprising an adhesive, wherein the conductive layer adhered to the ground portion and the test electrode by the adhesive.

15. The display apparatus of claim 13, wherein the conductive layer is connected to the ground portion and the test electrode.

16. The display apparatus of claim 13, wherein one connector terminal from among the connector terminals is electrically connected to the test electrode.

17. The display apparatus of claim 16, wherein another connector terminal from among the connector terminals is electrically connected to the ground portion.

18. The display apparatus of claim 13, wherein the conductive layer comprises a metal layer or conductive fabric comprising copper (Cu).

19. The display apparatus of claim 13, wherein the printed circuit board further comprises a first terminal and a second terminal, which are respectively electrically connected to the test electrode and the ground portion.

20. The display apparatus of claim 19, wherein the test electrode, the conductive layer, and the ground portion form a current path through which a current applied to the first terminal flows.

* * * * *